United States Patent
Nathan et al.

(10) Patent No.: US 9,608,583 B2
(45) Date of Patent: *Mar. 28, 2017

(54) PROCESS FOR ADJUSTING THE SOUND VOLUME OF A DIGITAL SOUND RECORDING

(71) Applicant: TouchTunes Music Corporation, New York, NY (US)

(72) Inventors: Guy Nathan, Nun's Island (CA); Dominique Dion, Laval (CA)

(73) Assignee: TouchTunes Music Corporation, New York, NY (US)

( * ) Notice: Subject to any disclaimer, the term of this patent is extended or adjusted under 35 U.S.C. 154(b) by 235 days.

This patent is subject to a terminal disclaimer.

(21) Appl. No.: 14/511,267

(22) Filed: Oct. 10, 2014

(65) Prior Publication Data

US 2015/0023526 A1 Jan. 22, 2015

Related U.S. Application Data

(63) Continuation of application No. 13/423,824, filed on Mar. 19, 2012, now Pat. No. 8,873,772, which is a
(Continued)

(30) Foreign Application Priority Data

Feb. 16, 2000 (FR) ...................... 00 01905

(51) Int. Cl.
*H03G 3/00* (2006.01)
*H03G 3/20* (2006.01)
(Continued)

(52) U.S. Cl.
CPC ......... *H03G 3/20* (2013.01); *G11B 20/10009* (2013.01); *G11B 20/10527* (2013.01); *H03G 3/3089* (2013.01); *G11B 2020/10546* (2013.01)

(58) Field of Classification Search
CPC .. H03G 3/20; H03G 3/3089; G11B 20/10009; G11B 20/10527; G11B 2020/10546
(Continued)

(56) References Cited

U.S. PATENT DOCUMENTS 3,807,541 A 4/1974 Kortenhaus
3,982,620 A 9/1976 Kortenhaus
(Continued)

FOREIGN PATENT DOCUMENTS

AU 199954012 4/2000
CN 1340939 3/2002
(Continued)

OTHER PUBLICATIONS

Patent Abstract of Japan vol. 95, No. 010 & JP 07 281682 A (Naguo Yuasa), 27 Oct. 1 JP 07 281682, figure 1-6 abrége.
(Continued)

*Primary Examiner* — Paul S Kim
(74) *Attorney, Agent, or Firm* — Nixon & Vanderhye, P.C.

(57) ABSTRACT

The present invention relates to a process for adjusting the sound volume of a digital sound recording characterised in that it comprises: a step consisting of determining, in absolute values, for a recording, the maximum amplitude values for sound frequencies audible for the human ear, a step consisting of calculating the possible gain for a specified sound level setting, between the maximum amplitude value determined above and the maximum amplitude value for all frequencies combined, a step consisting of reproducing the recording with a sound card by automatically adjusting the amplification gain level making it possible to obtain a sound level for the recording of a specified value so that it corresponds to the gain calculated for this recording.

15 Claims, 3 Drawing Sheets

Related U.S. Application Data continuation of application No. 11/513,018, filed on Aug. 31, 2006, now Pat. No. 8,165,318, which is a continuation of application No. 09/583,864, filed on Jun. 1, 2000, now Pat. No. 7,107,109.

(51) Int. Cl.
*G11B 20/10* (2006.01)
*H03G 3/30* (2006.01)

(58) Field of Classification Search
USPC .......................................................... 381/107
See application file for complete search history.

(56) References Cited

U.S. PATENT DOCUMENTS

| | | |
|---|---|---|
| 4,008,369 A | 2/1977 | Theurer et al. |
| 4,186,438 A | 1/1980 | Benson |
| 4,232,295 A | 11/1980 | McConnell |
| 4,335,809 A | 6/1982 | Wain |
| 4,335,908 A | 6/1982 | Burge |
| 4,336,935 A | 6/1982 | Goldfarb |
| 4,356,509 A | 10/1982 | Skerlos et al. |
| 4,369,442 A | 1/1983 | Werth et al. |
| 4,375,287 A | 3/1983 | Smith |
| 4,412,292 A | 10/1983 | Sedam |
| 4,413,260 A | 11/1983 | Siegel et al. |
| 4,521,014 A | 6/1985 | Sitrick |
| 4,528,643 A | 7/1985 | Freeny |
| 4,558,413 A | 12/1985 | Schmidt |
| 4,572,509 A | 2/1986 | Sitrick |
| 4,577,333 A | 3/1986 | Lewis et al. |
| 4,582,324 A | 4/1986 | Koza |
| 4,588,187 A | 5/1986 | Dell |
| 4,593,904 A | 6/1986 | Graves |
| 4,597,058 A | 6/1986 | Izumi |
| 4,636,951 A | 1/1987 | Harlick |
| 4,652,998 A | 3/1987 | Koza |
| 4,654,799 A | 3/1987 | Ogaki |
| 4,658,093 A | 4/1987 | Hellman |
| 4,667,802 A | 5/1987 | Verduin |
| 4,674,055 A | 6/1987 | Ogaki et al. |
| 4,675,538 A | 6/1987 | Epstein |
| 4,677,311 A | 6/1987 | Morita |
| 4,677,565 A | 6/1987 | Ogaki |
| 4,703,465 A | 10/1987 | Parker |
| 4,704,725 A | 11/1987 | Harvey et al. |
| 4,707,804 A | 11/1987 | Leal |
| 4,722,053 A | 1/1988 | Dubno |
| 4,761,684 A | 8/1988 | Clark |
| 4,766,581 A | 8/1988 | Korn |
| 4,787,050 A | 11/1988 | Suzuki |
| 4,792,849 A | 12/1988 | McCalley |
| 4,807,052 A | 2/1989 | Amano |
| 4,811,325 A | 3/1989 | Sharples |
| 4,814,972 A | 3/1989 | Winter et al. |
| 4,825,054 A | 4/1989 | Rust |
| 4,829,570 A | 5/1989 | Schotz |
| 4,852,154 A | 7/1989 | Lewis et al. |
| 4,857,714 A | 8/1989 | Sunyich |
| 4,868,832 A | 9/1989 | Marrington |
| 4,885,694 A | 12/1989 | Pray et al. |
| 4,905,279 A | 2/1990 | Nishio |
| 4,920,432 A | 4/1990 | Eggers |
| 4,922,420 A | 5/1990 | Nakagawa |
| 4,924,378 A | 5/1990 | Hershey |
| 4,926,485 A | 5/1990 | Yamashita |
| 4,937,807 A | 6/1990 | Weitz |
| 4,949,187 A | 8/1990 | Cohen |
| 4,953,159 A | 8/1990 | Hayden et al. |
| 4,956,768 A | 9/1990 | Sidi |
| 4,958,835 A | 9/1990 | Tashiro |
| 4,965,675 A | 10/1990 | Hori et al. |
| 4,977,593 A | 12/1990 | Ballance |
| 4,999,806 A | 3/1991 | Chernow |
| 5,008,814 A | 4/1991 | Mathur |
| 5,012,121 A | 4/1991 | Hammond |
| 5,027,426 A | 6/1991 | Chiocca |
| 5,041,921 A | 8/1991 | Scheffler |
| 5,046,093 A | 9/1991 | Wachob |
| 5,053,758 A | 10/1991 | Cornett et al. |
| 5,058,089 A | 10/1991 | Yoshimara |
| 5,077,607 A | 12/1991 | Johnson et al. |
| 5,081,534 A | 1/1992 | Geiger et al. |
| 5,101,451 A | 3/1992 | Ash et al. |
| 5,101,499 A | 3/1992 | Streck et al. |
| 5,106,097 A | 4/1992 | Levine |
| 5,117,407 A | 5/1992 | Vogel |
| 5,128,862 A | 7/1992 | Mueller |
| 5,138,712 A | 8/1992 | Corbin |
| 5,148,159 A | 9/1992 | Clark et al. |
| 5,155,847 A | 10/1992 | Kirouac |
| 5,159,678 A | 10/1992 | Wengelski et al. |
| 5,163,131 A | 11/1992 | Row |
| 5,166,886 A | 11/1992 | Molnar |
| 5,172,413 A | 12/1992 | Bradley et al. |
| 5,180,309 A | 1/1993 | Egnor |
| 5,189,630 A | 2/1993 | Barstow et al. |
| 5,191,573 A | 3/1993 | Hair |
| 5,191,611 A | 3/1993 | Lang |
| 5,192,999 A | 3/1993 | Graczyk |
| 5,197,094 A | 3/1993 | Tillery |
| 5,203,028 A | 4/1993 | Shiraishi |
| 5,210,854 A | 5/1993 | Beaverton et al. |
| 5,214,761 A | 5/1993 | Barrett et al. |
| 5,222,134 A | 6/1993 | Waite et al. |
| 5,228,015 A | 7/1993 | Arbiter et al. |
| 5,231,157 A | 7/1993 | Herzig et al. |
| 5,237,157 A | 8/1993 | Kaplan |
| 5,237,322 A | 8/1993 | Heberle |
| 5,239,480 A | 8/1993 | Huegel |
| 5,250,747 A | 10/1993 | Tsumura |
| 5,252,775 A | 10/1993 | Urano |
| 5,260,999 A | 11/1993 | Wyman |
| 5,261,104 A | 11/1993 | Bertram et al. |
| 5,262,875 A | 11/1993 | Mincer et al. |
| 5,276,866 A | 1/1994 | Paolini |
| 5,278,904 A | 1/1994 | Servi |
| 5,282,028 A | 1/1994 | Johnson et al. |
| 5,289,476 A | 2/1994 | Johnson et al. |
| 5,289,546 A | 2/1994 | Hetherington |
| 5,315,161 A | 5/1994 | Robinson |
| 5,315,711 A | 5/1994 | Barone et al. |
| 5,319,455 A | 6/1994 | Hoarty et al. |
| 5,321,846 A | 6/1994 | Yokota et al. |
| 5,327,230 A | 7/1994 | Dockery |
| 5,335,313 A | 8/1994 | Douglas |
| 5,339,095 A | 8/1994 | Redford |
| 5,339,413 A | 8/1994 | Koval |
| 5,341,350 A | 8/1994 | Frank |
| 5,355,302 A | 10/1994 | Martin |
| 5,357,276 A | 10/1994 | Banker |
| 5,369,778 A | 11/1994 | SanSoucie |
| 5,375,206 A | 12/1994 | Hunter |
| 5,386,251 A | 1/1995 | Movshovich |
| 5,389,950 A | 2/1995 | Bouton |
| 5,404,505 A | 4/1995 | Levinson |
| 5,406,634 A | 4/1995 | Anderson et al. |
| 5,408,417 A | 4/1995 | Wilder |
| 5,410,326 A | 4/1995 | Goldstein |
| 5,410,703 A | 4/1995 | Nilsson et al. |
| 5,418,713 A | 5/1995 | Allen |
| 5,420,923 A | 5/1995 | Beyers |
| 5,428,252 A | 6/1995 | Walker |
| 5,428,606 A | 6/1995 | Moskowitz |
| 5,431,492 A | 7/1995 | Rothschild |
| 5,440,632 A | 8/1995 | Bacon et al. |
| 5,444,499 A | 8/1995 | Saitoh |
| 5,445,295 A | 8/1995 | Brown |
| 5,455,619 A | 10/1995 | Truckenmiller et al. |
| 5,455,926 A | 10/1995 | Keele |
| 5,457,305 A | 10/1995 | Akel |
| 5,465,213 A | 11/1995 | Ross |
| 5,465,329 A | 11/1995 | Whisler |

(56) References Cited

U.S. PATENT DOCUMENTS

| | | |
|---|---|---|
| 5,467,326 A | 11/1995 | Miyashita et al. |
| 5,469,370 A | 11/1995 | Ostrover et al. |
| 5,469,573 A | 11/1995 | McGill et al. |
| 5,471,576 A | 11/1995 | Yee |
| 5,473,746 A | 12/1995 | Pritt et al. |
| 5,475,835 A | 12/1995 | Hickey |
| 5,481,509 A | 1/1996 | Knowles |
| 5,487,167 A | 1/1996 | Dinallo et al. |
| 5,489,103 A | 2/1996 | Okamoto |
| 5,495,610 A | 2/1996 | Shing |
| 5,496,178 A | 3/1996 | Back |
| 5,499,921 A | 3/1996 | Sone |
| 5,511,000 A | 4/1996 | Kaloi |
| 5,513,117 A | 4/1996 | Small |
| 5,515,173 A | 5/1996 | Mankovitz et al. |
| 5,519,435 A | 5/1996 | Anderson |
| 5,519,457 A | 5/1996 | Nishigaki et al. |
| 5,521,631 A | 5/1996 | Budow et al. |
| 5,521,918 A | 5/1996 | Kim |
| 5,521,922 A | 5/1996 | Fujinami et al. |
| 5,523,781 A | 6/1996 | Brusaw |
| 5,528,732 A | 6/1996 | Klotz |
| 5,532,734 A | 7/1996 | Goertz |
| 5,532,991 A | 7/1996 | Sasaki |
| 5,546,039 A | 8/1996 | Hewitt et al. |
| 5,548,729 A | 8/1996 | Akiyoshi |
| 5,550,577 A | 8/1996 | Verbiest |
| 5,554,968 A | 9/1996 | Lee |
| 5,555,244 A | 9/1996 | Gupta |
| 5,557,515 A | 9/1996 | Abbruzzese et al. |
| 5,557,541 A | 9/1996 | Schulhof |
| 5,557,724 A | 9/1996 | Sampat et al. |
| 5,559,505 A | 9/1996 | McNair |
| 5,559,549 A | 9/1996 | Hendricks |
| 5,559,714 A | 9/1996 | Banks et al. |
| 5,561,709 A | 10/1996 | Remillard |
| 5,565,908 A | 10/1996 | Ahmad |
| 5,566,237 A | 10/1996 | Dobbs |
| 5,570,363 A | 10/1996 | Holm |
| 5,578,999 A | 11/1996 | Matsuzawa et al. |
| 5,579,404 A | 11/1996 | Fielder et al. |
| 5,583,561 A | 12/1996 | Baker et al. |
| 5,583,937 A | 12/1996 | Ullrich et al. |
| 5,583,994 A | 12/1996 | Rangan |
| 5,583,995 A | 12/1996 | Gardner et al. |
| 5,592,482 A | 1/1997 | Abraham |
| 5,592,551 A | 1/1997 | Lett |
| 5,592,611 A | 1/1997 | Midgely et al. |
| 5,594,509 A | 1/1997 | Florin |
| 5,596,702 A | 1/1997 | Stucka et al. |
| 5,607,099 A | 3/1997 | Yeh et al. |
| 5,612,581 A | 3/1997 | Kageyama |
| 5,613,909 A | 3/1997 | Stelovsky |
| 5,616,876 A | 4/1997 | Cluts |
| 5,617,565 A | 4/1997 | Augenbraun et al. |
| 5,619,247 A | 4/1997 | Russo |
| 5,619,249 A | 4/1997 | Billock et al. |
| 5,619,250 A | 4/1997 | McClellan et al. |
| 5,619,698 A | 4/1997 | Lillich |
| 5,623,666 A | 4/1997 | Pike |
| 5,631,693 A | 5/1997 | Wunderlich et al. |
| 5,636,276 A | 6/1997 | Brugger |
| 5,638,426 A | 6/1997 | Lewis |
| 5,642,337 A | 6/1997 | Oskay |
| 5,643,831 A | 7/1997 | Ochiai et al. |
| 5,644,714 A | 7/1997 | Kikinis |
| 5,644,766 A | 7/1997 | Coy |
| 5,654,714 A | 8/1997 | Takahashi et al. |
| 5,659,466 A | 8/1997 | Norris et al. |
| 5,661,517 A | 8/1997 | Budow et al. |
| 5,661,802 A | 8/1997 | Nilssen |
| 5,663,756 A | 9/1997 | Blahut et al. |
| 5,668,592 A | 9/1997 | Spaulding |
| 5,668,778 A | 9/1997 | Quazi |
| 5,668,788 A | 9/1997 | Allison |
| 5,675,734 A | 10/1997 | Hair |
| 5,680,533 A | 10/1997 | Yamato et al. |
| 5,684,716 A | 11/1997 | Freeman |
| 5,689,641 A | 11/1997 | Ludwig et al. |
| 5,691,778 A | 11/1997 | Song |
| 5,691,964 A | 11/1997 | Niederlein et al. |
| 5,696,914 A | 12/1997 | Nahaboo et al. |
| 5,697,844 A | 12/1997 | Von Kohorn |
| 5,703,795 A | 12/1997 | Mankovitz |
| 5,708,811 A | 1/1998 | Arendt |
| 5,712,976 A | 1/1998 | Falcon |
| 5,713,024 A | 1/1998 | Halladay |
| 5,715,416 A | 2/1998 | Baker |
| 5,717,452 A | 2/1998 | Janin et al. |
| 5,721,583 A | 2/1998 | Harada et al. |
| 5,721,815 A | 2/1998 | Ottesen et al. |
| 5,721,827 A | 2/1998 | Logan et al. |
| 5,721,829 A | 2/1998 | Dunn et al. |
| 5,724,525 A | 3/1998 | Beyers et al. |
| 5,726,909 A | 3/1998 | Krikorian |
| 5,734,719 A | 3/1998 | Tsevdos |
| 5,734,961 A | 3/1998 | Castille |
| 5,739,451 A | 4/1998 | Winksy et al. |
| 5,743,745 A | 4/1998 | Reintjes |
| 5,745,391 A | 4/1998 | Topor |
| 5,748,254 A | 5/1998 | Harrison et al. |
| 5,748,468 A | 5/1998 | Notenboom et al. |
| 5,748,954 A | 5/1998 | Mauldin |
| 5,751,336 A | 5/1998 | Aggarwal et al. |
| 5,752,232 A | 5/1998 | Basore et al. |
| 5,757,936 A | 5/1998 | Lee |
| 5,758,340 A | 5/1998 | Nail |
| 5,761,655 A | 6/1998 | Hoffman |
| 5,762,552 A | 6/1998 | Vuong |
| 5,774,527 A | 6/1998 | Handelman et al. |
| 5,774,668 A | 6/1998 | Choquier |
| 5,774,672 A | 6/1998 | Funahashi |
| 5,778,395 A | 7/1998 | Whiting |
| 5,781,889 A | 7/1998 | Martin |
| 5,786,784 A | 7/1998 | Gaudichon |
| 5,790,172 A | 8/1998 | Imanaka |
| 5,790,671 A | 8/1998 | Cooper |
| 5,790,856 A | 8/1998 | Lillich |
| 5,790,935 A | 8/1998 | Payton |
| 5,793,364 A | 8/1998 | Bolanos et al. |
| 5,793,980 A | 8/1998 | Glaser |
| 5,798,785 A | 8/1998 | Hendricks |
| 5,802,283 A | 9/1998 | Grady et al. |
| 5,802,558 A | 9/1998 | Pierce |
| 5,802,599 A | 9/1998 | Cabrera |
| 5,805,804 A | 9/1998 | Laursen et al. |
| 5,808,224 A | 9/1998 | Kato |
| 5,809,246 A | 9/1998 | Goldman |
| 5,812,643 A | 9/1998 | Schelberg et al. |
| 5,815,146 A | 9/1998 | Youden et al. |
| 5,825,884 A | 10/1998 | Zdepski et al. |
| 5,828,343 A | 10/1998 | MacDonald et al. |
| 5,831,555 A | 11/1998 | Yu et al. |
| 5,831,663 A | 11/1998 | Waterhouse et al. |
| 5,832,024 A | 11/1998 | Schotz et al. |
| 5,832,287 A | 11/1998 | Atalla |
| 5,835,843 A | 11/1998 | Haddad |
| 5,842,869 A | 12/1998 | McGregor et al. |
| 5,845,104 A | 12/1998 | Rao |
| 5,845,256 A | 12/1998 | Pescitelli et al. |
| 5,848,398 A | 12/1998 | Martin |
| 5,851,149 A | 12/1998 | Xidos et al. |
| 5,854,887 A | 12/1998 | Kindell |
| 5,857,020 A | 1/1999 | Peterson |
| 5,857,707 A | 1/1999 | Devlin |
| 5,862,324 A | 1/1999 | Collins |
| 5,864,811 A | 1/1999 | Tran et al. |
| 5,864,868 A | 1/1999 | Contois |
| 5,864,870 A | 1/1999 | Guck |
| 5,867,714 A | 2/1999 | Todd |
| 5,870,721 A | 2/1999 | Norris |
| 5,880,386 A | 3/1999 | Wachi et al. |
| 5,880,769 A | 3/1999 | Nemirofsky et al. |
| 5,884,028 A | 3/1999 | Kindell |

(56) References Cited

U.S. PATENT DOCUMENTS

| | | |
|---|---|---|
| 5,884,298 A | 3/1999 | Smith |
| 5,887,139 A | 3/1999 | Madison, Jr. et al. |
| 5,887,193 A | 3/1999 | Takahashi |
| 5,893,162 A | 4/1999 | Lau et al. |
| 5,895,455 A | 4/1999 | Bellinger et al. |
| 5,896,094 A | 4/1999 | Narisada et al. |
| 5,903,266 A | 5/1999 | Berstis et al. |
| 5,913,040 A | 6/1999 | Rakavy |
| 5,914,712 A | 6/1999 | Sartain et al. |
| 5,915,094 A | 6/1999 | Kouloheris |
| 5,915,238 A | 6/1999 | Tjaden |
| 5,917,537 A | 6/1999 | Lightfoot |
| 5,917,835 A | 6/1999 | Barrett |
| 5,918,213 A | 6/1999 | Bernard et al. |
| 5,920,700 A | 7/1999 | Gordon et al. |
| 5,920,702 A | 7/1999 | Bleidt et al. |
| 5,923,885 A | 7/1999 | Johnson |
| 5,926,531 A | 7/1999 | Petite |
| 5,926,624 A | 7/1999 | Katz et al. |
| 5,930,765 A | 7/1999 | Martin |
| 5,931,908 A | 8/1999 | Gerba |
| 5,933,090 A | 8/1999 | Christenson |
| 5,940,504 A | 8/1999 | Griswold |
| 5,949,411 A | 9/1999 | Doerr et al. |
| 5,949,688 A | 9/1999 | Montoya |
| 5,953,429 A | 9/1999 | Wakai et al. |
| 5,956,716 A | 9/1999 | Kenner et al. |
| 5,959,869 A | 9/1999 | Miller |
| 5,959,945 A | 9/1999 | Kleiman |
| 5,960,167 A | 9/1999 | Roberts et al. |
| 5,963,916 A | 10/1999 | Kaplan |
| 5,966,495 A | 10/1999 | Takahashi |
| 5,970,467 A | 10/1999 | Alavi |
| 5,978,855 A | 11/1999 | Metz |
| 5,978,912 A | 11/1999 | Rakavy et al. |
| 5,980,261 A | 11/1999 | Mino et al. |
| 5,999,499 A | 12/1999 | Pines et al. |
| 5,999,624 A | 12/1999 | Hopkins |
| 6,002,720 A | 12/1999 | Yurt |
| 6,005,599 A | 12/1999 | Asai et al. |
| 6,008,735 A | 12/1999 | Chiloyan et al. |
| 6,009,274 A | 12/1999 | Fletcher |
| 6,011,758 A | 1/2000 | Dockes et al. |
| 6,018,337 A | 1/2000 | Peters |
| 6,018,726 A | 1/2000 | Tsumura |
| 6,021,386 A | 2/2000 | Davis |
| 6,023,705 A | 2/2000 | Bellinger et al. |
| 6,025,868 A | 2/2000 | Russo |
| 6,034,925 A | 3/2000 | Wehmeyer |
| 6,038,591 A | 3/2000 | Wolfe et al. |
| 6,040,829 A | 3/2000 | Croy et al. |
| 6,041,354 A | 3/2000 | Biliris et al. |
| 6,049,891 A | 4/2000 | Inamoto |
| 6,054,987 A | 4/2000 | Richardson |
| 6,055,573 A | 4/2000 | Gardenswartz et al. |
| 6,057,874 A | 5/2000 | Michaud |
| 6,069,672 A | 5/2000 | Claassen |
| 6,072,982 A | 6/2000 | Haddad |
| 6,107,937 A | 8/2000 | Hamada |
| 6,118,450 A | 9/2000 | Proehl et al. |
| 6,124,804 A | 9/2000 | Kitao et al. |
| 6,131,088 A | 10/2000 | Hill |
| 6,131,121 A | 10/2000 | Mattaway et al. |
| 6,134,547 A | 10/2000 | Huxley et al. |
| 6,138,150 A | 10/2000 | Nichols et al. |
| 6,148,142 A | 11/2000 | Anderson |
| 6,151,077 A | 11/2000 | Vogel et al. |
| 6,151,634 A | 11/2000 | Glaser |
| 6,154,207 A | 11/2000 | Farris et al. |
| 6,157,935 A | 12/2000 | Tran et al. |
| 6,161,059 A | 12/2000 | Tedesco et al. |
| 6,167,358 A | 12/2000 | Othmer et al. |
| 6,170,060 B1 | 1/2001 | Mott et al. |
| 6,173,172 B1 | 1/2001 | Masuda et al. |
| 6,175,861 B1 | 1/2001 | Williams, Jr. et al. |
| 6,182,126 B1 | 1/2001 | Nathan et al. |
| 6,185,184 B1 | 2/2001 | Mattaway et al. |
| 6,185,619 B1 | 2/2001 | Joffe et al. |
| 6,191,780 B1 | 2/2001 | Martin et al. |
| 6,192,340 B1 | 2/2001 | Abecassis |
| 6,195,732 B1 | 2/2001 | Adams et al. |
| 6,198,408 B1 | 3/2001 | Cohen |
| 6,202,060 B1 | 3/2001 | Tran |
| 6,209,060 B1 | 3/2001 | Machida |
| 6,212,138 B1 | 4/2001 | Kalis et al. |
| 6,216,175 B1 | 4/2001 | Sliger et al. |
| 6,216,227 B1 | 4/2001 | Goldstein et al. |
| 6,219,692 B1 | 4/2001 | Stiles |
| 6,223,209 B1 | 4/2001 | Watson |
| 6,226,412 B1 | 5/2001 | Schwab |
| 6,226,715 B1 | 5/2001 | Van Der Wolf et al. |
| 6,240,550 B1 | 5/2001 | Nathan et al. |
| 6,243,725 B1 | 6/2001 | Hempleman et al. |
| 6,247,022 B1 | 6/2001 | Yankowski |
| 6,256,773 B1 | 7/2001 | Bowman-Amuah |
| 6,262,569 B1 | 7/2001 | Carr et al. |
| 6,280,327 B1 | 8/2001 | Leifer et al. |
| 6,282,709 B1 | 8/2001 | Reha et al. |
| 6,288,688 B1 | 9/2001 | Hughes et al. |
| 6,288,991 B1 | 9/2001 | Kajiyama et al. |
| 6,289,382 B1 | 9/2001 | Bowman-Amuah |
| 6,292,443 B1 | 9/2001 | Awazu et al. |
| 6,298,373 B1 | 10/2001 | Burns et al. |
| 6,301,710 B1 | 10/2001 | Fujiwara |
| 6,302,793 B1 | 10/2001 | Fertitta et al. |
| 6,308,204 B1 | 10/2001 | Nathan et al. |
| 6,311,214 B1 | 10/2001 | Rhoads |
| 6,315,572 B1 | 11/2001 | Owens et al. |
| 6,323,911 B1 | 11/2001 | Schein et al. |
| 6,332,025 B2 | 12/2001 | Takahashi et al. |
| 6,336,219 B1 | 1/2002 | Nathan |
| 6,341,166 B1 | 1/2002 | Basel |
| 6,344,862 B1 | 2/2002 | Williams et al. |
| 6,346,951 B1 | 2/2002 | Mastronardi |
| 6,353,820 B1 | 3/2002 | Edwards et al. |
| 6,356,971 B1 | 3/2002 | Katz et al. |
| 6,359,616 B1 | 3/2002 | Ogura et al. |
| 6,359,661 B1 | 3/2002 | Nickum |
| 6,370,580 B2 | 4/2002 | Kriegsman |
| 6,381,575 B1 | 4/2002 | Martin et al. |
| 6,384,737 B1 | 5/2002 | Hsu et al. |
| 6,393,584 B1 | 5/2002 | McLaren et al. |
| 6,396,480 B1 | 5/2002 | Schindler et al. |
| 6,397,189 B1 | 5/2002 | Martin et al. |
| 6,407,987 B1 | 6/2002 | Abraham |
| 6,408,435 B1 | 6/2002 | Sato |
| 6,408,437 B1 | 6/2002 | Hendricks et al. |
| 6,421,651 B1 | 7/2002 | Tedesco et al. |
| 6,425,125 B1 | 7/2002 | Fries et al. |
| 6,430,537 B1 | 8/2002 | Tedesco et al. |
| 6,430,738 B1 | 8/2002 | Gross et al. |
| 6,434,678 B1 | 8/2002 | Menzel |
| 6,438,450 B1 | 8/2002 | DiLorenzo |
| 6,442,549 B1 | 8/2002 | Schneider |
| 6,446,080 B1 | 9/2002 | Van Ryzin et al. |
| 6,446,130 B1 | 9/2002 | Grapes |
| 6,449,688 B1 | 9/2002 | Peters et al. |
| 6,470,496 B1 | 10/2002 | Kato et al. |
| 6,473,794 B1 | 10/2002 | Guheen et al. |
| 6,488,508 B2 | 12/2002 | Okamoto |
| 6,490,570 B1 | 12/2002 | Numaoka |
| 6,493,871 B1 | 12/2002 | Welch et al. |
| 6,496,927 B1 | 12/2002 | McGrane et al. |
| 6,498,855 B1 * | 12/2002 | Kokkosoulis .......... H03G 7/007 381/104 |
| 6,522,707 B1 | 2/2003 | Brandstetter et al. |
| 6,535,911 B1 | 3/2003 | Miller et al. |
| 6,538,558 B2 | 3/2003 | Sakazume et al. |
| 6,543,052 B1 | 4/2003 | Ogasawara |
| 6,544,122 B2 | 4/2003 | Araki et al. |
| 6,549,719 B2 | 4/2003 | Mankovitz |
| 6,560,651 B2 | 5/2003 | Katz et al. |
| 6,570,507 B1 | 5/2003 | Lee et al. |
| 6,571,282 B1 | 5/2003 | Bowman-Amuah |

(56) References Cited

U.S. PATENT DOCUMENTS

| | | |
|---|---|---|
| 6,577,735 B1 | 6/2003 | Bharat |
| 6,578,051 B1 | 6/2003 | Mastronardi et al. |
| 6,587,403 B1 | 7/2003 | Keller et al. |
| 6,590,838 B1 | 7/2003 | Gerlings et al. |
| 6,598,230 B1 | 7/2003 | Ballhorn |
| 6,622,307 B1 | 9/2003 | Ho |
| 6,628,939 B2 | 9/2003 | Paulsen |
| 6,629,318 B1 | 9/2003 | Radha et al. |
| 6,643,620 B1 | 11/2003 | Contolini et al. |
| 6,643,690 B2 | 11/2003 | Duursma et al. |
| 6,654,801 B2 | 11/2003 | Mann et al. |
| 6,658,090 B1 | 12/2003 | Pehkonen et al. |
| 6,662,231 B1 | 12/2003 | Drosset et al. |
| 6,702,585 B2 | 3/2004 | Okamoto |
| 6,724,974 B2 | 4/2004 | Naruto et al. |
| 6,728,824 B1 | 4/2004 | Chen |
| 6,728,956 B2 | 4/2004 | Ono |
| 6,728,966 B1 | 4/2004 | Arsenault et al. |
| 6,744,882 B1 | 6/2004 | Gupta et al. |
| 6,751,794 B1 | 6/2004 | McCaleb et al. |
| 6,755,744 B1 | 6/2004 | Nathan et al. |
| 6,762,585 B2 | 7/2004 | Liao |
| 6,789,215 B1 | 9/2004 | Rupp et al. |
| 6,816,578 B1 | 11/2004 | Kredo et al. |
| 6,850,252 B1 | 2/2005 | Hoffberg |
| 6,898,161 B1 | 5/2005 | Nathan |
| 6,904,592 B1 | 6/2005 | Johnson |
| 6,920,614 B1 | 7/2005 | Schindler et al. |
| 6,928,653 B1 | 8/2005 | Ellis et al. |
| 6,934,700 B1 | 8/2005 | Ijdens et al. |
| 6,942,574 B1 | 9/2005 | LeMay et al. |
| 6,974,076 B1 | 12/2005 | Siegel |
| 7,024,485 B2 | 4/2006 | Dunning et al. |
| 7,073,172 B2 | 7/2006 | Chamberlain |
| 7,103,583 B1 | 9/2006 | Baum et al. |
| 7,107,109 B1 | 9/2006 | Nathan et al. |
| 7,111,129 B2 | 9/2006 | Percival |
| 7,114,013 B2 | 9/2006 | Bakke et al. |
| 7,124,194 B2 | 10/2006 | Nathan et al. |
| 7,181,458 B1 | 2/2007 | Higashi |
| 7,188,352 B2 | 3/2007 | Nathan et al. |
| 7,195,157 B2 | 3/2007 | Swartz et al. |
| 7,198,571 B2 | 4/2007 | LeMay et al. |
| 7,205,471 B2 | 4/2007 | Looney et al. |
| 7,206,417 B2 | 4/2007 | Nathan |
| 7,210,141 B1 | 4/2007 | Nathan et al. |
| 7,231,656 B1 | 6/2007 | Nathan |
| 7,237,198 B1 | 6/2007 | Chaney |
| 7,281,652 B2 | 10/2007 | Foss |
| 7,293,277 B1 | 11/2007 | Nathan |
| 7,356,831 B2 | 4/2008 | Nathan |
| 7,406,529 B2 | 7/2008 | Reed |
| 7,415,707 B2 | 8/2008 | Taguchi et al. |
| 7,418,474 B2 | 8/2008 | Schwab |
| 7,424,731 B2 | 9/2008 | Nathan et al. |
| 7,430,736 B2 | 9/2008 | Nguyen et al. |
| 7,433,832 B1 | 10/2008 | Bezos et al. |
| 7,448,057 B1 | 11/2008 | Nathan |
| 7,483,958 B1 | 1/2009 | Elabbady et al. |
| 7,500,192 B2 | 3/2009 | Mastronardi |
| 7,512,632 B2 | 3/2009 | Mastronardi et al. |
| 7,519,442 B2 | 4/2009 | Nathan et al. |
| 7,522,631 B1 | 4/2009 | Brown et al. |
| 7,533,182 B2 | 5/2009 | Wurtzel et al. |
| 7,549,919 B1 | 6/2009 | Nathan et al. |
| 7,574,727 B2 | 8/2009 | Nathan et al. |
| 7,647,613 B2 | 1/2010 | Drakoulis et al. |
| 7,657,910 B1 | 2/2010 | McAulay et al. |
| 7,749,083 B2 | 7/2010 | Nathan et al. |
| 7,757,264 B2 | 7/2010 | Nathan |
| 7,761,538 B2 | 7/2010 | Lin et al. |
| 7,770,165 B2 | 8/2010 | Olson et al. |
| 7,778,879 B2 | 8/2010 | Nathan et al. |
| 7,783,593 B2 | 8/2010 | Espino |
| 7,783,774 B2 | 8/2010 | Nathan et al. |
| 7,793,331 B2 | 9/2010 | Nathan et al. |
| 7,819,734 B2 | 10/2010 | Nathan et al. |
| 7,822,687 B2 | 10/2010 | Brillon et al. |
| 7,992,178 B1 | 8/2011 | Nathan et al. |
| 7,996,873 B1 | 8/2011 | Nathan et al. |
| 8,015,200 B2 | 9/2011 | Seiflien et al. |
| 8,028,318 B2 | 9/2011 | Nathan |
| 8,032,879 B2 | 10/2011 | Nathan et al. |
| 8,037,412 B2 | 10/2011 | Nathan et al. |
| 8,052,512 B2 | 11/2011 | Nathan et al. |
| 8,103,589 B2 | 1/2012 | Nathan et al. |
| 8,151,304 B2 | 4/2012 | Nathan et al. |
| 8,165,318 B2 | 4/2012 | Nathan et al. |
| 8,292,712 B2 | 10/2012 | Nathan et al. |
| 8,332,895 B2 | 12/2012 | Nathan et al. |
| 8,429,530 B2 | 4/2013 | Neuman et al. |
| 2001/0016815 A1 | 8/2001 | Takahashi et al. |
| 2001/0023403 A1 | 9/2001 | Martin et al. |
| 2001/0030660 A1 | 10/2001 | Zainoulline |
| 2001/0030912 A1 | 10/2001 | Kalis et al. |
| 2001/0037367 A1 | 11/2001 | Iyer |
| 2001/0044725 A1 | 11/2001 | Matsuda et al. |
| 2002/0002079 A1 | 1/2002 | Martin et al. |
| 2002/0002483 A1 | 1/2002 | Siegel et al. |
| 2002/0113824 A1 | 8/2002 | Myers, Jr. |
| 2002/0116476 A1 | 8/2002 | Eyal et al. |
| 2002/0118949 A1 | 8/2002 | Jones et al. |
| 2002/0120925 A1 | 8/2002 | Logan |
| 2002/0123331 A1 | 9/2002 | Lehaff et al. |
| 2002/0126141 A1 | 9/2002 | Mastronardi |
| 2002/0129036 A1 | 9/2002 | Ho Yuen Lok et al. |
| 2002/0162104 A1 | 10/2002 | Raike et al. |
| 2003/0004833 A1 | 1/2003 | Pollak et al. |
| 2003/0005099 A1 | 1/2003 | Sven et al. |
| 2003/0006911 A1 | 1/2003 | Smith et al. |
| 2003/0008703 A1 | 1/2003 | Gauselmann |
| 2003/0018740 A1 | 1/2003 | Sonoda et al. |
| 2003/0027120 A1 | 2/2003 | Jean |
| 2003/0031096 A1 | 2/2003 | Nathan et al. |
| 2003/0041093 A1 | 2/2003 | Yamane et al. |
| 2003/0065639 A1 | 4/2003 | Fiennes et al. |
| 2003/0076380 A1 | 4/2003 | Yusef et al. |
| 2003/0088538 A1 | 5/2003 | Ballard |
| 2003/0093790 A1 | 5/2003 | Logan et al. |
| 2003/0101450 A1 | 5/2003 | Davidsson et al. |
| 2003/0104865 A1 | 6/2003 | Itkis et al. |
| 2003/0108164 A1 | 6/2003 | Laurin et al. |
| 2003/0135424 A1 | 7/2003 | Davis et al. |
| 2003/0144910 A1 | 7/2003 | Flaherty et al. |
| 2003/0176218 A1 | 9/2003 | LeMay et al. |
| 2003/0191753 A1 | 10/2003 | Hoch |
| 2003/0208586 A1 | 11/2003 | Mastronardi et al. |
| 2003/0225834 A1 | 12/2003 | Lee et al. |
| 2004/0010800 A1 | 1/2004 | Goci |
| 2004/0025185 A1 | 2/2004 | Goci et al. |
| 2004/0085334 A1 | 5/2004 | Reaney |
| 2004/0103150 A1 | 5/2004 | Ogdon et al. |
| 2004/0145477 A1 | 7/2004 | Easter et al. |
| 2004/0158555 A1 | 8/2004 | Seedman et al. |
| 2004/0204220 A1 | 10/2004 | Fried et al. |
| 2004/0205171 A1 | 10/2004 | Nathan et al. |
| 2004/0220926 A1 | 11/2004 | Lamkin et al. |
| 2005/0048816 A1 | 3/2005 | Higgins |
| 2005/0060405 A1 | 3/2005 | Nathan et al. |
| 2005/0073782 A1 | 4/2005 | Nathan |
| 2005/0086172 A1 | 4/2005 | Stefik |
| 2005/0111671 A1 | 5/2005 | Nathan |
| 2005/0125833 A1 | 6/2005 | Nathan et al. |
| 2005/0201254 A1 | 9/2005 | Looney et al. |
| 2005/0267819 A1 | 12/2005 | Kaplan |
| 2006/0018208 A1 | 1/2006 | Nathan et al. |
| 2006/0031896 A1 | 2/2006 | Pulitzer |
| 2006/0035707 A1 | 2/2006 | Nguyen et al. |
| 2006/0062094 A1 | 3/2006 | Nathan et al. |
| 2006/0143575 A1 | 6/2006 | Sauermann |
| 2006/0227673 A1 | 10/2006 | Yamashita et al. |
| 2006/0239131 A1 | 10/2006 | Nathan et al. |
| 2006/0293773 A1 | 12/2006 | Nathan et al. |
| 2007/0025701 A1 | 2/2007 | Kawasaki et al. |

(56) References Cited

U.S. PATENT DOCUMENTS

| | | |
|---|---|---|
| 2007/0086280 A1 | 4/2007 | Cappello et al. |
| 2007/0121430 A1 | 5/2007 | Nathan et al. |
| 2007/0139410 A1 | 6/2007 | Abe et al. |
| 2007/0142022 A1 | 6/2007 | Madonna et al. |
| 2007/0160224 A1 | 7/2007 | Nathan |
| 2007/0204263 A1 | 8/2007 | Nathan et al. |
| 2007/0209053 A1 | 9/2007 | Nathan |
| 2007/0220052 A1 | 9/2007 | Kudo et al. |
| 2007/0247979 A1 | 10/2007 | Brillon et al. |
| 2008/0065925 A1 | 3/2008 | Oliverio et al. |
| 2008/0066016 A1 | 3/2008 | Dowdy et al. |
| 2008/0069545 A1 | 3/2008 | Nathan et al. |
| 2008/0077962 A1 | 3/2008 | Nathan |
| 2008/0086379 A1 | 4/2008 | Dion et al. |
| 2008/0096659 A1 | 4/2008 | Kreloff et al. |
| 2008/0137849 A1 | 6/2008 | Nathan |
| 2008/0155588 A1 | 6/2008 | Roberts et al. |
| 2008/0168807 A1 | 7/2008 | Dion et al. |
| 2008/0171594 A1 | 7/2008 | Fedesna et al. |
| 2008/0195443 A1 | 8/2008 | Nathan et al. |
| 2008/0198271 A1 | 8/2008 | Malki |
| 2008/0222199 A1 | 9/2008 | Tiu et al. |
| 2008/0239887 A1 | 10/2008 | Tooker et al. |
| 2008/0305738 A1 | 12/2008 | Khedouri et al. |
| 2009/0030802 A1 | 1/2009 | Plotnick et al. |
| 2009/0037969 A1 | 2/2009 | Nathan et al. |
| 2009/0042632 A1 | 2/2009 | Guenster et al. |
| 2009/0063976 A1 | 3/2009 | Bull et al. |
| 2009/0070341 A1 | 3/2009 | Mastronardi et al. |
| 2009/0091087 A1 | 4/2009 | Wasmund |
| 2009/0100092 A1 | 4/2009 | Seiflein et al. |
| 2009/0138111 A1 | 5/2009 | Mastronardi |
| 2009/0172565 A1 | 7/2009 | Jackson et al. |
| 2009/0177301 A1 | 7/2009 | Hayes |
| 2009/0241061 A1 | 9/2009 | Asai et al. |
| 2009/0265734 A1 | 10/2009 | Dion et al. |
| 2009/0282491 A1 | 11/2009 | Nathan |
| 2009/0287696 A1 | 11/2009 | Galuten |
| 2009/0307314 A1 | 12/2009 | Smith et al. |
| 2010/0042505 A1 | 2/2010 | Straus |
| 2010/0211818 A1 | 8/2010 | Nathan et al. |
| 2010/0241259 A1 | 9/2010 | Nathan |
| 2010/0247081 A1 | 9/2010 | Victoria Pons |
| 2010/0269066 A1 | 10/2010 | Nathan et al. |
| 2010/0299232 A1 | 11/2010 | Nathan et al. |
| 2011/0066943 A1 | 3/2011 | Brillon et al. |
| 2011/0246517 A1 | 10/2011 | Nathan et al. |
| 2011/0270894 A1 | 11/2011 | Mastronardi et al. |
| 2011/0283236 A1 | 11/2011 | Beaumier et al. |
| 2011/0321026 A1 | 12/2011 | Nathan et al. |
| 2012/0009985 A1 | 1/2012 | Nathan et al. |
| 2012/0053713 A1 | 3/2012 | Nathan |
| 2012/0105464 A1 | 5/2012 | Franceus |
| 2012/0143732 A1 | 6/2012 | Nathan et al. |
| 2012/0150614 A1 | 6/2012 | Dion et al. |
| 2012/0158531 A1 | 6/2012 | Dion et al. |
| 2012/0166965 A1 | 6/2012 | Nathan et al. |
| 2012/0177228 A1 | 7/2012 | Nathan et al. |
| 2012/0240140 A1 | 9/2012 | Nathan |
| 2012/0323652 A1 | 12/2012 | Mastronardi et al. |
| 2013/0021281 A1 | 1/2013 | Tse et al. |
| 2013/0040715 A1 | 2/2013 | Nathan et al. |
| 2013/0044995 A1 | 2/2013 | Cappello et al. |
| 2013/0070093 A1 | 3/2013 | Rivera et al. |
| 2013/0091054 A1 | 4/2013 | Nathan et al. |
| 2014/0026154 A1 | 1/2014 | Nathan |

FOREIGN PATENT DOCUMENTS

| | | |
|---|---|---|
| DE | 3406058 | 8/1985 |
| DE | 3723737 | 1/1988 |
| DE | 3723737 A1 | 1/1988 |
| DE | 3820835 | 1/1989 |
| DE | 3820835 A1 | 1/1989 |
| DE | A 3820835 | 1/1989 |
| DE | 3815071 | 11/1989 |
| DE | 4244198 | 6/1994 |
| DE | 19539172 | 9/1996 |
| DE | 19610739 | 9/1997 |
| DE | 19904007 | 8/2000 |
| EP | 0082077 | 6/1983 |
| EP | A 0082077 | 6/1983 |
| EP | 0140593 | 5/1985 |
| EP | 0140593 A2 | 5/1985 |
| EP | 0256921 | 2/1988 |
| EP | 0 283 304 | 9/1988 |
| EP | 0283304 | 9/1988 |
| EP | 0283350 | 9/1988 |
| EP | A 0283350 | 9/1988 |
| EP | 0309298 | 3/1989 |
| EP | 0313359 | 4/1989 |
| EP | A 0313359 | 4/1989 |
| EP | 0340787 | 11/1989 |
| EP | 0 363 186 | 4/1990 |
| EP | 0363186 | 4/1990 |
| EP | 0 425 168 A | 5/1991 |
| EP | 0425168 | 5/1991 |
| EP | 0464562 | 1/1992 |
| EP | 0464562 A2 | 1/1992 |
| EP | 0 480 558 | 4/1992 |
| EP | 0480558 | 4/1992 |
| EP | 0498130 | 8/1992 |
| EP | 0498130 A2 | 8/1992 |
| EP | 0 507 110 | 10/1992 |
| EP | 0507110 | 10/1992 |
| EP | 0529834 | 3/1993 |
| EP | 0538319 | 4/1993 |
| EP | 0538319 B1 | 4/1993 |
| EP | 0631283 | 12/1994 |
| EP | A 0631283 | 12/1994 |
| EP | 0632371 | 1/1995 |
| EP | 0711076 | 5/1996 |
| EP | 0786122 | 7/1997 |
| EP | 0786122 B1 | 7/1997 |
| EP | 0817103 | 1/1998 |
| EP | 0841616 | 5/1998 |
| EP | 0841616 A2 | 5/1998 |
| EP | 0919964 | 6/1999 |
| EP | 0959570 | 11/1999 |
| EP | 0959570 A1 | 11/1999 |
| EP | 0 974896 A1 | 1/2000 |
| EP | 0974896 | 1/2000 |
| EP | 0974941 | 1/2000 |
| EP | 0982695 | 3/2000 |
| EP | 1001391 | 5/2000 |
| EP | 1170951 | 1/2002 |
| EP | 1288802 | 3/2003 |
| EP | 1408427 | 4/2004 |
| EP | 1549919 | 4/2004 |
| EP | 1962251 | 8/2008 |
| FR | 2602352 | 2/1988 |
| FR | A 2602352 | 2/1988 |
| FR | 2808906 | 11/2001 |
| GB | 2122799 | 1/1984 |
| GB | A 2122799 | 1/1984 |
| GB | 2166328 | 4/1986 |
| GB | 2166328 A | 4/1986 |
| GB | 2170943 | 8/1986 |
| GB | 2193420 | 2/1988 |
| GB | 2 238680 A | 6/1991 |
| GB | 2238680 | 6/1991 |
| GB | 2254469 | 10/1992 |
| GB | 2259398 | 3/1993 |
| GB | 2262170 | 6/1993 |
| GB | 2262170 A | 6/1993 |
| GB | 2380377 | 4/2003 |
| GB | 2505584 | 8/2014 |
| JP | 57-173207 | 10/1982 |
| JP | 57173207 | 10/1982 |
| JP | 58-179892 | 10/1983 |
| JP | 60-253082 | 12/1985 |
| JP | 61084143 | 4/1986 |
| JP | 62-192849 | 8/1987 |
| JP | 62-284496 | 12/1987 |

(56) References Cited

FOREIGN PATENT DOCUMENTS

| | | |
|---|---|---|
| JP | 63-60634 | 3/1988 |
| JP | 2-153665 | 6/1990 |
| JP | 5-74078 | 3/1993 |
| JP | 5122282 | 5/1993 |
| JP | 07281682 | 10/1995 |
| JP | 07-311587 | 11/1995 |
| JP | 08-279235 | 10/1996 |
| JP | 8274812 | 10/1996 |
| JP | 08279235 | 10/1996 |
| JP | 08289976 | 11/1996 |
| JP | 928918 | 2/1997 |
| JP | 9114470 | 5/1997 |
| JP | 9127964 | 5/1997 |
| JP | 09-244900 | 9/1997 |
| JP | 10-098344 | 4/1998 |
| JP | 10-222537 | 8/1998 |
| JP | 11-003088 | 1/1999 |
| JP | 11-024686 | 1/1999 |
| JP | 11-095768 | 4/1999 |
| JP | 2002-83640 | 3/2002 |
| JP | 2002-537584 | 11/2002 |
| JP | 2003-076380 | 3/2003 |
| JP | 2003-084903 | 3/2003 |
| JP | 2003-099072 | 4/2003 |
| JP | 2005-107267 | 4/2005 |
| JP | 2005-184237 | 7/2005 |
| JP | 2006-048076 | 2/2006 |
| JP | 2007-034253 | 2/2007 |
| JP | 2007-041722 | 2/2007 |
| JP | 2007/505410 | 3/2007 |
| JP | 07504517 | 3/2007 |
| JP | 2007-102982 | 4/2007 |
| JP | 2007-104072 | 4/2007 |
| JP | 2007-128609 | 5/2007 |
| JP | 2007-164078 | 6/2007 |
| JP | 2007-164298 | 6/2007 |
| JP | 2007/179333 | 7/2007 |
| JP | 2007-241748 | 9/2007 |
| JP | 2008-058656 | 3/2008 |
| JP | 2009-017529 | 1/2009 |
| JP | 2009-075540 | 4/2009 |
| WO | WO 86/01326 | 2/1986 |
| WO | WO 86 01326 A | 2/1986 |
| WO | WO 90/00429 | 1/1990 |
| WO | WO 90/07843 | 7/1990 |
| WO | WO A 90 07843 | 7/1990 |
| WO | WO 91/08542 | 6/1991 |
| WO | WO 91/20082 | 12/1991 |
| WO | WO A 91 20082 | 12/1991 |
| WO | WO 93/16557 | 8/1993 |
| WO | WO 93/18465 | 9/1993 |
| WO | WO A 93 18465 | 9/1993 |
| WO | WO 93/21732 | 10/1993 |
| WO | WO 94/03894 | 2/1994 |
| WO | WO A 94 03894 | 2/1994 |
| WO | WO 94/14273 | 6/1994 |
| WO | WO 94/15306 | 7/1994 |
| WO | WO 94/15416 | 7/1994 |
| WO | WO 94 15416 A | 7/1994 |
| WO | WO 95/03609 | 2/1995 |
| WO | WO 95 03609 A | 2/1995 |
| WO | WO 95/29537 | 11/1995 |
| WO | WO 96/12255 | 4/1996 |
| WO | WO 96/12256 | 4/1996 |
| WO | WO 96/12257 | 4/1996 |
| WO | WO 96/12258 | 4/1996 |
| WO | WO 96 12258 A | 4/1996 |
| WO | WO 98/07940 | 2/1998 |
| WO | WO 98/11487 | 3/1998 |
| WO | WO 98/45835 | 10/1998 |
| WO | WO 99/35753 | 7/1999 |
| WO | WO 01/00290 | 1/2001 |
| WO | WO 01/08148 | 2/2001 |
| WO | WO 01/71608 | 9/2001 |
| WO | WO 01/84353 | 11/2001 |
| WO | WO 02/060546 | 8/2002 |
| WO | WO 02/095752 | 11/2002 |
| WO | WO 03/069613 | 8/2003 |
| WO | WO 2004/029775 | 4/2004 |
| WO | 2005/026916 | 3/2005 |
| WO | WO 2006/014739 | 2/2006 |
| WO | WO 2006/056933 | 6/2006 |
| WO | WO 2007/092542 | 8/2007 |
| WO | WO 2008-033853 | 3/2008 |
| WO | WO 2011094330 | 8/2011 |
| WO | WO 2013/040603 | 3/2013 |

OTHER PUBLICATIONS

Bonczck, Robert H. et al, "The DSS Development System", 1983 National Computer Conference, Anaheim, California, May 16-19, 1983, pp. 441-455.
"Robotic Wafer Handling System for Class 10 Environments" IBM Technical Disclosure Bulletin, vol. 32, No. 9A, Feb. 1990, pp. 141-143.
"High-speed Opens and Shorts Substrate Tester", IBM Technical Disclosure Bulletin, vol. 33, No. 12, May 1991, pp. 251-259.
"Darts Revolution Again", Replay Magazine, Mar. 1991, pp. 146-148.
Galen A. Grimes, "Chapter 18, Taking Advantage or Web-based Audio."
Petri Koskelainem "Report on Streamworks™".
W. Richard Stevens, "TCP/IP Illustrated: vol. 1, the Protocols".
Nowell Outlaw "Virtual Servers Offer Performance benefits for Networks Imaging".
IBM Technical Disclosure Bulletin, vol. 30, No. 5, Oct. 1987, "Method for Automated Assembly of Software Versions", pp. 353-355.
Pohlmann, Principles of Digital Audio, Third Edition, 1995.
Ahanger et al.; A Digital On-Demand Video Service Supporting Content-Based Queries; 1993; 9 pages.
Austin Cyber Limits: Name That Tune [online], [retrieved Jul. 23, 2001]. Retrieved from the Internet: <http://www.pbs.ork/klru/austin/games/namethattune.html>.
Back to the Tunes [online], [retrieved Jul. 23, 2001]. Retrieved from the Internet: <http://citc5.hispeed.com/rules.html>.
Bonczek et al, "The DSS Development System", 1983 National Computer Conference, Anaheim, California, May 16-19, 1983, pp. 441-455.
Chan et al., "Distributed servers architectures for networked video services", IEEE Trans on Networking, vol. 9, No. 2, pp. 125-136, 2001.
Chen et al., "Optimization of the grouped sweeping scheduling (GSS) with heterogeneous multimedia streams", ACM Multimedia, pp. 1-7, 1993.
Crutcher et al., "The networked video Jukebox", IEEE, Trans. on circuits and systems for video technology, vol. 4, No. 2, pp. 105-120, 1994.
Derfler et al., "How Networks Work", Millennium Ed., Que Corporation, Jan. 2000.
Drews, C.; Pestoni, F.; "Virtual jukebox: reviving a classic," Proceedings of the 35th Annual Hawaii International Conference System Sciences, pp. 887-893, Jan. 7-10, 2002.
"Ecast Forges Landmark International Technology Partnership", Business Wire at www.findarticles.com/cf_0/m0EIN/2000_July_25/63663604/print.html, 2 pages, Jul. 25, 2000.
"Ecast Selects Viant to Build Siren Entertainment System (TM)", ScreamingMedia, PR Newswire San Francisco, industry.java.sum.com/javanews/stories/story2/0,1072,17618,00.html, 3 pages, Aug. 3, 1999.
Fachbuch, "Unterhaltungselektronic von A-Z" gfu 1, VDE-Verlag GmbH, pp. 12-13, 1983-1984.
"Foobar 2000 Evaluation Updated," MonkeyBiz, Aug. 3, 2008, 4 pages (with partial English translation). http://monkeybizinfo.blogspot.jp/2008/08/foobar2000.html.
Gallardo et al., "Tangible Jukebox: back to palpable music", ACM TEI, pp. 199-202, 2010.

(56) References Cited

OTHER PUBLICATIONS

Gralla, "How the Internet Works", Millennium Ed., Que Corporation, Aug. 1999.
Hewlett-Packard Development Co; HP Open View Storage Data Protector Admin's Guideline Manual Edition; May 2003; Copyright 2003, 60 pages http://h20000.www2.hp.com/bc/docs/support/SupportManual/c006637931/c00663793.pdf.
Hicks et al., "Dynamic software updating", ACM PLDI, pp. 13-23, 2001.
IBM Technical Disclosure Bulletin, vol. 32, No. 9A, Feb. 1990, "Robotic Wafer Handling System for Class 10 Environments" pp. 141-143.
IBM Technical Disclosure Bulletin, vol. 33, No. 12, May 1991, "High-speed Opens and Shorts Substrate Tester", pp. 251-259.
IBM Technical Disclosure Bulletin, vol. 41, No. 1, Jan. 1998, "Safe Mechanism for Installing Operating System Updates with Applications," pp. 557-559.
iTouch 8 Plus brochure, JVL Corporation, 2005, 2 pages.
iTouch 27 New Games brochure, JVL Corporation, 2005, 2 pages.
Johnny Rockets Name That Tune [online], [retrieved Mar. 7, 2002]. Retrieved from the Internet: <http://www.johnnyrockets.com/docs/funstuff.html>.
Kozierok, The PC Guide, Site Version 2.2.0, http://www.pcguide.com, Apr. 17, 2001.
Kraiss et al., "Integrated document caching and prefetching in storage hierarchies based on Markov chain predictions", The VLDB Journal, vol. 7, issue 3, pp. 141-162, 1998.
Liang et al., "Dynamic class loading in the Java virtual machine", ACM OOPSLA, pp. 36-44, 1998.
Look and iTouch brochure, JVL Corporation, 2004, 2 pages.
Ludescher et al., "File Storage Management for TFTF physics data", IEEE, pp. 856-859, 1992.
Megatouch Champ brochure, Merit Industries, Inc., 2005, 2 pages.
Melnik et al., "A mediation infrastructure for digital library services", ACM DL, pp. 123-132, 2000.
Mickey B's Jukebox Revue—Name That Tune! [online], [retrieved Jul. 23, 2001]. Retrieved from the Internet: <http://mickeyb.com/tune/>.
Mod Box Internet brochure, Merit Entertainment, 2006, 2 pages.
Newsome et al., "Proxy compilation of dynamically loaded java classes with MoJo", ACM LCTES, pp. 204-212, Jun. 2002.
Outlaw, Computer Technology Review, "Virtual Servers Offer Performance Benefits for Network Imaging", 1993.
Peter Pawlowski, "Basic Player Whose Appearance and Functions can be Customized Freely 'Foobar 2000' v1.0 is Unveiled," Windows Forest, Japan, Jan. 12, 2010, 3 pages (with partial English translation). http://forest.impress.co.jp/docs/news/20100112_341870.html.
Pohlmann, "Principles of Digital Audio", Third Edition, 1995.
PR Newswire, Press Release, "MusicMatch Announces Commerical Availability of Meta Trust Certified MusicMatch jukebox", New York; Nov. 15, 1999, extracted from Internet, http://proquest.umi.com on Sep. 17, 2002.
Rollins et al., "Pixie: A jukebox architecture to support efficient peer content exchange", ACM Multimedia, pp. 179-188, 2002.
Schneier, "Applied Cryptography", Second Edition, John Wiley & Sons, Inc. New York, 1996.
Sprague et al., "Music selection using the partyvote democratic Jukebox", ACM AVI, pp. 433-436, 2008.
Stewart, "Ecast Deploys Marimba's Castanet to Power an Internet-Based, Entertainment Management System for the Out-of-Home Market", Marimba, Press Release, 3 pages, www.marimba.com/news/releases/ecast.dec13.html, Dec. 13, 1999.
Strauss et al., "Information Jukebox A semi public device for presenting multimedia information content", Pers. Ubiquit Comput, 7, pp. 217-220, 2003.
Tom & Liz's Name That Tune [online], [retrieved Jul. 23, 2001]. Retrieved from the Internet: <http://home.att.net/~tomnliz/Music.html>.
Vortex Brochure, JVL Corporation, 2005, 2 pages.
Waingrow, "Unix Hints & Hacks", Que Corporation, Indianapolis, IN, 1999.
White, "How Computers Work", Millennium Ed., Que Corporation, Indianapolis, IN, Sep. 1999 (Sep. 22, 1999).
Yuki Murata, iTunes no 'Kankyo Settei' Catalog & Tips 10 Sen, Mac People, ASCII Corporation, Oct. 1, 2007.

\* cited by examiner

PROCESS FOR ADJUSTING THE SOUND VOLUME OF A DIGITAL SOUND RECORDING

CROSS-REFERENCES TO RELATED APPLICATIONS

This application is a continuation of application Ser. No. 11/513,018 filed Aug. 31, 2006, which is a continuation of application Ser. No. 09/583,864 filed Jun. 1, 2000, which claims priority to French Application No. 0001905 filed Feb. 16, 2000, the entire content of which is herby incorporated by reference in their entirety.

FIELD OF THE INVENTION

The present invention relates to a process for adjusting the sound volume of a digital sound recording reproduced by an item of equipment. This process is essentially intended to be used during the reproduction of a digital recording in the form of a data file by means of a sound card, for example, of an audiovisual reproduction system, such as a jukebox.

BACKGROUND OF THE INVENTION

In the prior art, it is known that digital recordings, such as compact disks (CD), are not reproduced with the same sound volume for a specified sound setting level. This is essentially due to the type of music and the way in which the piece of music was recorded. Indeed, a sound frame is composed of an electrical signal comprising a succession of oscillations and peaks. Each peak corresponds to a voltage value. The higher the voltage in terms of absolute value, the higher the volume and the higher the slope of the signal variation, the higher the frequency of the sound reproduced. When such a recording is recorded in the form of a digital file and then reproduced on a sound system by means of a digital sound card on a computer, the same maximum variation phenomena are observed since the data contained in the file is approximately the same as that recorded on a CD. Consequently, between two recordings of different types of music, it is necessary to modify the sound level setting between two recordings, to obtain a reproduction with the same sound level for two different recordings with different original sound levels.

OBJECTS AND SUMMARY OF THE INVENTION

Therefore, the purpose of the present invention is to remedy the disadvantages of the prior art by proposing a process for adjusting the sound level of a digital sound recording making it possible to obtain identical sound levels in different recordings, irrespective of the differences in the digital sound recording level existing initially between each of the recordings.

This purpose is achieved by the fact that the process comprises: a step consisting of determining, in absolute values, for a recording, the maximum amplitude values for sound frequencies audible for the human ear, a step consisting of calculating the possible gain for a specified sound level setting, between the maximum amplitude value determined above and the maximum amplitude value for all frequencies combined, a step consisting of reproducing the recording with a sound card by automatically adjusting the amplification gain level making it possible to obtain a sound level for the recording of a specified value so that it corresponds to the gain calculated for this recording.

According to another feature, the maximum amplitude value determination step comprises: a step consisting of counting the number of samples of the recording with a specified amplitude, for all the amplitudes existing in the recording, a step consisting of classifying the amplitudes of the number of samples found in increasing order, a step consisting of storing in memory the maximum amplitude, for all frequencies combined, and the amplitude, for which the order number in the classification carried out is n ranks less with reference to the rank of the maximum amplitude, the amplitude found corresponding in this case to the maximum amplitude for frequencies audible for the human ear.

According to another feature, n is determined so that the degradation of the reproduction quality of the recording is not perceptible to the human ear.

According to another feature, n is of the order of 10 and preferably equal to 4 or 5.

According to another feature, the maximum amplitude value determination step comprises: a step consisting of counting the number of samples of the recording with a specified amplitude, for all the amplitudes existing in the recording, a step consisting of classifying the amplitudes of the number of samples found in increasing order, a step consisting of calculating the mean value Amean of the n' highest amplitudes occurring at least k' times in the recording.

According to another feature, the maximum amplitude value determination step comprises: a step consisting of compressing the recording by means of at least one psycho-acoustic mask making it possible to eliminate inaudible sounds from the initial recording, a step consisting of decompressing the recording, a step consisting of searching the maximum amplitude on the decompressed recording, this amplitude corresponding in this case to the maximum amplitude for frequencies audible for the human ear.

According to another feature, the psycho-acoustic mask(s) is/are applied using the MPEG-1 Layer 3 process.

According to another feature, the reproduction step comprises a dynamic reproduction sound level adjustment step on the recording consisting of authorizing a specified gain for the low-pitched and/or high-pitched sounds in the recording, the gain corresponding approximately to the attenuation applied during the reproduction of the recording.

Another purpose of the invention consists of a use of the process according to the invention in an audiovisual reproduction system, such as a digital jukebox.

This purpose is achieved by the fact that the automatic volume adjustment process is used on a digital audiovisual reproduction system, this use being characterized in that the recording is stored in memory in the reproduction system with the corresponding calculated gain and audiovisual reproduction system reading means giving access to the gain value to control the gain circuits of the digital signal processing processor of the digital audiovisual reproduction system to adjust the sound level accordingly.

BRIEF DESCRIPTION OF DRAWINGS

Other features and advantages of the present invention will be understood more clearly upon reading the description below with reference to the appended drawings, wherein.

DESCRIPTION OF THE PREFERRED EMBODIMENTS

Before starting the description of the invention, it is necessary to give some notes on digital recording. First of all, sound reproduction by a loud speaker consists of applying voltages of specified levels to said loud speaker, according to a specified frequency to vibrate a membrane and, therefore, produce the sound corresponding to the specified frequency. For a given amplification value, the root mean square voltage value defines the sound volume or sound level.

Figure 3:
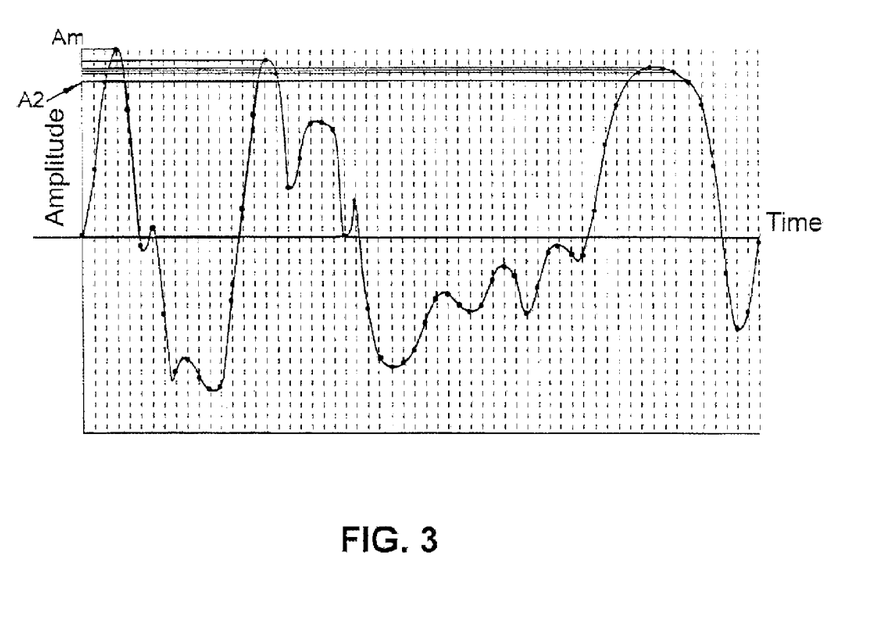
FIG. 3 represents a sound frame of a recording.

A sound frame, represented in FIG. 3, is therefore formed by superimposing oscillations representing the variations over time of the amplitude of the power supply voltage of an acoustic reproduction component such as a loud speaker. The digitisation of a sound recording consists, in fact, of performing sampling of the sound frame and, therefore, reading the voltage values according to time intervals determined by a periodicity. The shorter the period, the more precise the digitisation. During the reproduction of the recording, the analogue signal is reconstructed from digital samples stored during the digitisation. The dots on the curve represent the samples used during the digitisation.

In this way, depending on the type of music, the curve C representing the frequency of the reproduced sound, defined by the slope of the curve C and the corresponding voltage value of the maximum sound levels, for the same sound amplification circuit setting, the output level of the loud speakers will be different. Indeed, the maximum root mean square voltages observed for a first recording will not necessarily be of the same order as the maximum root mean square voltages observed for a second recording. Therefore, the purpose of the invention is to provide a solution for this disadvantage such that, between two recordings, the volume or sound level perceived by the listener is automatically adjusted so that the sound level is the same from one recording to another.

The invention requires, firstly, a preliminary analysis of each recording liable to be reproduced on an audiovisual reproduction system or on a computer and, secondly, a correction of the amplification level during the sound reproduction of the recording, according to the analysis.

A first solution consists of searching, in absolute values, the maximum voltage observed on each recording, and using this value to amplify the recordings such that, for a specified sound level setting, this values reaches the same voltage value for all the recordings. However, a sound frame of a recording comprises sounds with frequencies that are both audible and inaudible for the human ear. In this way, if the maximum amplitude corresponds to an inaudible frequency, the adjustment of the volume will not be adapted.

Figure 2A:
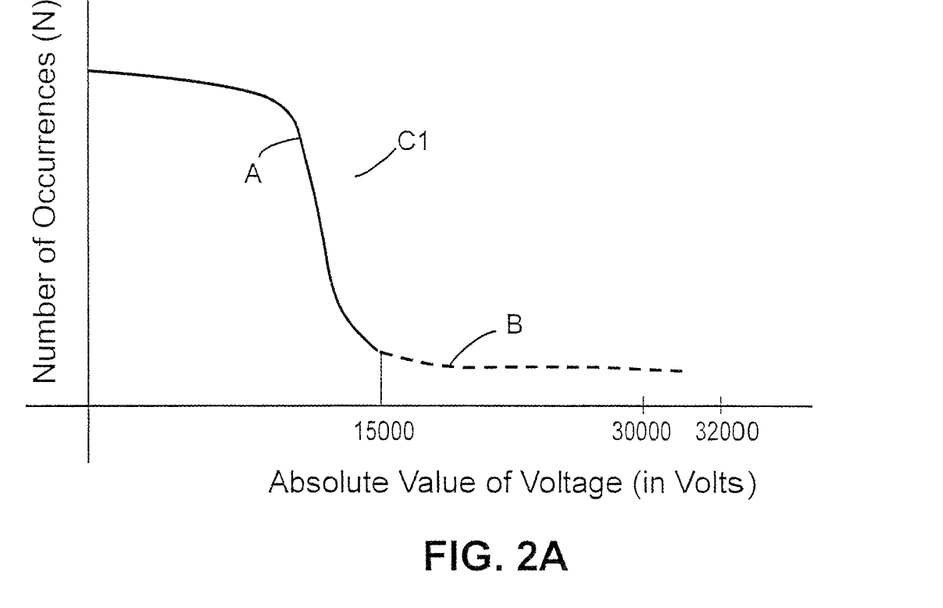
FIGS. 2A and 2B represent a curve representing the frequency of the occurrence of a voltage in a digital recording.

Therefore, the process according to the invention consists, in a first step, of determining, for a recording, the maximum amplitude only for frequencies audible for the human ear. In a first embodiment variant, this maximum amplitude is determined by analyzing the digital recording to classify the number of samples of the recording for each amplitude, in increasing order of amplitude, in absolute values. This classification is represented in FIG. 2A. The Y-axis represents the number N of occurrences of a specified amplitude in the recording and the X-axis represents in absolute values the number representing the voltage of the analogue signal in volts during the digital encoding of the analogue signal with a precision of 16 bits. During the digitisation of the analogue signal representing a sound signal, each sampled voltage is encoded with a number between −32767 and 32767 when the precision is 16 bits.

Empirically, it is observed that a recording corresponding to a song only comprises a few samples, of the order of ten, located in the portion B of the curve C1, with the highest amplitudes in the recording. In this way, the portion B of the curve C1 is represented with dashes to show that all the values of the numbers representing the voltages of the corresponding analogue signal are not represented. Similarly, it is observed that 90% of the samples of a recording have a low amplitude, i.e. located in the portion A of the curve C1.

According to the invention, the maximum amplitude is selected, in the classification carried out, as the amplitude n ranks less with reference to the rank of the maximum amplitude sample of the recording. In other words, if 1 corresponds to the rank of the number representing the amplitude and K is the rank of the number representing the maximum amplitude found on the digital recording, then the amplitude selected as the maximum amplitude for the process corresponds to the rank number K-n, from the classification defined and corresponding to the curve C1. In this way, the n−1 samples, located on portion B of the curve C1 are not taken into account, using the maximum amplitude as a basis, implying that these samples do not appear in the final reproduction. Then, the recording volume correction, i.e. the possible volume gain Gv for the recording is determined by applying the following formula: $Gv = 20 \log(A_2/Am)$ a In this formula, $A_2$ is the selected amplitude and Am is the maximum amplitude of the recording.

In practice, the higher the value of n, the more degraded the recording reproduction quality. Indeed, the higher the value of n, the higher the number of high-amplitude samples that will not be taken into account, and the higher the probability of the samples not taken into account corresponding to audible signals. Consequently, when the gain calculated using the above formula is applied to the recording, some sound frequencies will be over-amplified, resulting in a saturation phenomenon on the loud speakers and, therefore, in a degradation of the reproduction quality. It has been observed that a value of n of the order of 10, preferably equal to 4 to 5, does not induce a perceptible degradation during the reproduction of the recording after applying the gain calculated using the formula above. This variant can only be applied effectively to digital recordings that have not undergone prior compression or processing aiming to optimize the volume level.

On the basis of the classification carried out above, another variant for determining the value of the selected amplitude may be carried out. According to this variant, the value of the selected amplitude corresponds to the mean value $A_{mean}$ of the n' highest amplitudes occurring at least k' times in the recording. Then, the value of the possible volume gain Gv for the recording is determined by applying the formula a above, replacing $A_2$ by $A_{mean}$.

The experiment showed that, by choosing n' equal to 2 and k' equal to 4, the sound recording reproduction did not show any degradation audible for the human ear. The higher the values of n' and k', the higher the degradation of the sound recording reproduction.

Figure 2B:
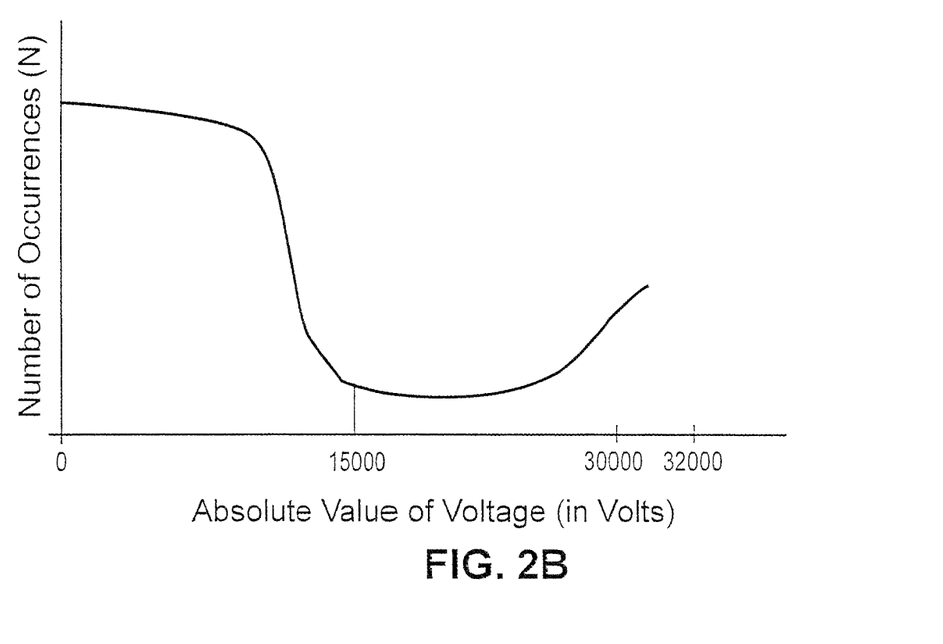

FIG. 2B represents the result of the classification carried out on a recording having undergone processing aiming to optimize the sound level. Indeed, recordings that have undergone this type of processing already take the presence of inaudible frequencies into consideration and tend to eliminate these frequencies for the benefit of improved recording volume management. For these specific recordings having undergone processing to optimize the volume, since the number of samples with a high amplitude value is higher, these amplitudes also correspond to audible signals. Consequently, the step described above is applicable but results in a perceptible degradation of the reproduction of the recording.

For recordings having undergone optimization processing, the determination step of the maximum amplitude for audible signals consists of compressing the recording according to a compression process using at least one psycho-acoustic mask making it possible to eliminate inaudible sounds from the recording. For example, it is possible to use the known MPEG-1 Layer 3 process or any other compression process such as AAC. Indeed, it is known that the MPEG compression process uses masks to eliminate any unnecessary data from the recording. The unnecessary data in the sound recording includes all the inaudible frequencies and all the sound variations which are not perceptible to the human ear. Then, the recording is decompressed and the value of the maximum amplitude is located in this decompressed recording. In this way, during the decompression, the decompressed recording only contains audible frequency sounds. Searching the maximum amplitude in this decompressed recording does not necessarily produce a maximum amplitude Am for an audible frequency. In this embodiment variant, it is also advisable to store in memory before compression, the maximum amplitude of the recording, for all frequencies combined, in order to be able to calculate the gain according to the formula a. This second embodiment variant may be applied to any type of recording, since the MPEG compression process is indifferent to the initial recording type.

The gain value calculated by means of the formula a is then stored in memory with the sound recording produced, for example, on a server or on the audiovisual reproduction system, and used during the recording reproduction by the reproduction system. Indeed, during the reproduction of the initial digital recording, the gain calculated for this recording is added during the sound setting.

The process according to the invention is particularly used when digital recordings are reproduced by means of a sound card of a computer or an audiovisual data reproduction system. Therefore, the process according to the invention requires having determined the gain either arbitrarily or using a preliminary analysis of each recording liable to be reproduced by the sound card. As described above, this analysis consists of determining the gain liable to be applied to each recording during its reproduction. The gain is, for example, stored in memory in a database on storage means of the computer or reproduction system and can be accessed by the sound card management program, such that each recording stored on the storage means of the computer or the reproduction system is associated with a gain in the database. In this way, before the reproduction of a specified recording, the sound card management program consults its database and collects the data representing the gain calculated for this recording. During the setting of the sound of the recording, the level selected by the user will be automatically adjusted by a value corresponding to the calculated gain Gv, such that the real sound level indeed corresponds to the level selected by the user and is homogeneous for all the recordings contained in the storage means. The adjustment may be made by a positive or negative value.

Another variant of the process according to the invention consists of adjusting the gain for the sound signals of a recording corresponding to low-pitched and/or high-pitched sounds. The aim of the process is to increase, when possible, the gain for low-pitched and/or high-pitched sounds without exceeding the sound level selected by the user and without exceeding a maximum gain set for low-pitched and/or high-pitched sounds. It is necessary to underline that, in this variant, only low-pitched and/or high-pitched sounds are concerned by the dynamic gain adjustment, when the reproduction enables independent setting of the general sound level and the sound level of low-pitched and/or high-pitched sounds. In this way, when the sound level of low-pitched and/or high-pitched sounds is less than the sound level selected by the user, an additional gain is authorized on low-pitched and/or high-pitched sounds to increase the perception of low-pitched and/or high-pitched sounds to improve the reproduction quality of the recording. This additional gain will be at most equal to the gain requested by the user for low-pitched and/or high-pitched sounds.

The maximum volume is obtained when the incoming signal on the amplifier is not attenuated, i.e. at a gain of 0 dB. So as to obtain a gain for low-pitched and/or high-pitched sounds systematically, the overall maximum volume for the recording may be less than zero dB and the maximum volume of low-pitched and/or high-pitched sounds is determined so that the incoming gain in the amplifier can be equal to zero dB. Consequently, it is always possible to obtain a gain for low-pitched and/or high-pitched sounds corresponding to the absolute value of the recording volume attenuation. In this way, for example, if the recording volume attenuation is −3 dB, the gain for low-pitched and/or high-pitched sounds is 3 dB. So as to limit the influence of the dynamic adjustment of low-pitched and/or high-pitched sounds, the maximum low-pitched and/or high-pitched sound gain is limited, for example to 12 dB. In this way, even if, for a specified volume, the gain for low-pitched and/or high-pitched sounds may be 16 dB, for example, it will only actually be 12 dB.

Figure 1:
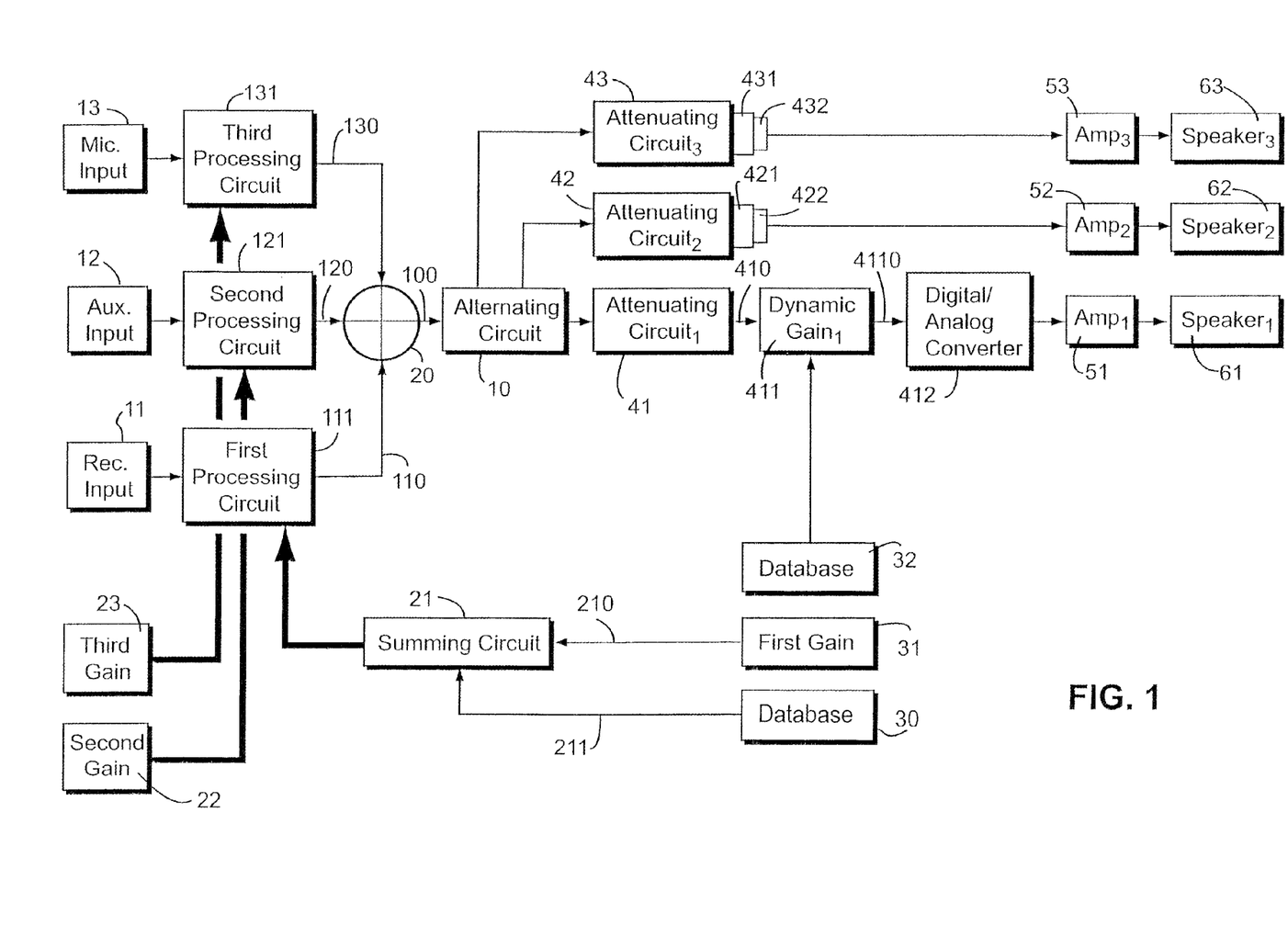
FIG. 1 represents a block diagram of a sound card using the process according to the invention.

For example, FIG. 1 represents a block diagram of a sound card using the process according to the invention. This sound card is connected, for example, to a central processing unit (not shown) of a computer or a reproduction system comprising, particularly, storage means in which a sound card management program, or pilot, is particularly stored. The sound card represented in FIG. 1 comprises, for example, 3 inputs 11, 12, 13. A first input 11 receives the signals representing the recordings, for example, through an MPEG decoder, the second input 12 receives signals from an auxiliary source and the third input 13 receives signals from a microphone. The signals from the different inputs are converted, if required, into digital signals. Then, the sound card management program assigns each input 11, 12, 13, by means of a first processing circuit 111, 121, 131, with a gain 21, 22, 23 corresponding to that stored in the central processing unit database linked with the recording produced. For the microphone input 13 and the auxiliary source input 12, this is a predefined gain 22, 23, set according to the characteristics of the microphone and auxiliary source. For the input 11 receiving the signals corresponding to the recordings, the sound card management program collects, in its database 30 stored in the central processing unit, the gain calculated according to the formula a for the incoming recording on the first input and a gain 31 accounting for the use of an MPEG decoder, for example. These two gains are then applied to the inputs 210, 211 of a summing circuit 21, the output of which is connected to the first processing circuit 111 linked to the input 11 of the MPEG decoder. The three signals 110, 120, 130 modified in this way are then summed and mixed by a signal summer 20, to form a single signal 100. This signal 100 is then attenuated by an attenuating electronic circuit 10 of a specified fixed value. Indeed, if the sound levels of the input signals 110, 120, 130 are all similar to the sound level selected by the user, then the sum of these signals will necessarily exceed this maximum level selected by the user, hence the need to reduce the sound level of the signal resulting from the sum of the tree signals 110, 120, 130 systematically so that, in the most unfavorable case, it is not greater than the maximum level selected by the user. The signal 100 is then assigned to at least one zone, e.g. three. The term zone refers to an area equipped with at least one loud speaker 61, 62, 63 connected to the sound card by means of an amplifier 51, 52, 53. For each zone, the sound level of the signal is modified according to the maximum sound level selected by the user for each of these zones. To do this, the maximum level selected by the user for each zone is previously stored in memory, for example, in a database of the central processing unit, and then, during reproduction, collected by the sound card management program and sent to an attenuating circuit 41, 42, 43 linked with each zone. Then, the signal 410 modified in this way according to the setting of each zone may be modified again by a dynamic gain 411, 421, 431 assigned to low-pitched and/or high-pitched sounds, as described above. To do this, the sound card management program assigns a gain to the low-pitched and/or high-pitched sound signals contained in the output signal of each zone. This gain corresponds to the attenuation applied to the output signal of each zone. In other words, if the output signal of a zone is attenuated, for example by 6 dB, so as not to exceed the sound level selected by the user, the low-pitched and/or high-pitched sound signals will be increased by 6 dB. The attenuation assigned to each zone is collected by the sound card management program in a database 32 or a specific file stored in the central processing unit.

Once the dynamic low-pitched and/or high-pitched sound adjustment has been carried out, the digital signal 4110 is applied to the input of a digital/analogue converter 412, 422, 423, the output of which is connected to the input of an amplifier 51, 52, 53 on which loud speakers 61, 62, 63 are connected.

It is understood that the process according to the invention makes it possible, after prior determination of the possible volume gain for each recording, to reproduce all the digital recordings analyzed, with the same sound level, for the same sound setting selected by a user.

It must be clear for those experienced in the art that the present invention enables embodiments in many other specific forms without leaving the field of the invention as claimed. Consequently, the present embodiments must be considered as illustrations, but may be modified in the field defined by the scope of the claims attached, and the invention must not be limited to the details given above.

What is claimed is:

1. A method for adjusting sound volume of a recording, the method comprising:
    determining a maximum amplitude value for sound frequencies audible for the human ear in the recording,
    calculating a volume gain, for a specified sound level as being the root mean square of voltage values applied to a speaker for the recording, based on the ratio of the determined maximum amplitude value to a maximum amplitude value for all frequencies combined corresponding to the specified sound level, and
    reproducing the recording by automatically adjusting an amplification level based on the calculated volume gain to obtain the specified sound level,
    wherein the reproducing further comprises dynamically adjusting a sound level of the recording by authorizing a specified gain for low-pitched and/or high-pitched sounds in the recording, the specified gain corresponding approximately to the calculated volume gain applied during the reproducing of the recording.

2. The method according to claim 1, wherein the specified sound level is selected by a user.

3. The method according to claim 1, wherein the recording is stored to a digital file.

4. The method according to claim 1, wherein
    the calculating further comprises specifying a sound level for at least one of a plurality of zones, and
    the reproducing further comprises assigning the reproduced recording to one of the plurality of zones so that the reproduced recording corresponds to the sound level specified for the zone.

5. The method according to claim 4, wherein each one of the plurality of zones is equipped with at least one speaker.

6. The method according to claim 1, wherein the calculated volume gain is stored in memory of a computer.

7. The method according to claim 1, wherein the calculated volume gain is stored in a database on storage of a computer.

8. The method according to claim 1, wherein the reproducing comprises:
    adjusting the specified sound level based on the calculated volume gain to make the sound level of the reproduced recording correspond to the specified sound level,
    calculating a second volume gain, for the adjusted sound level, based on the ratio of the determined maximum amplitude value to a maximum amplitude value for all frequencies combined corresponding to the adjusted sound level, and
    reproducing the recording by automatically adjusting an amplification level based on the calculated second volume gain to obtain the adjusted sound level.

9. The method according to claim 1, wherein
    the determining comprises:
    defining a maximum amplitude of the recording for all frequencies combined corresponding to a specified sound level,
    compressing the recording to remove inaudible original recording sounds,
    decompressing the compressed recording, and
    determining a maximum amplitude for frequencies audible to the human ear in the recording, and
    the calculating comprises calculating a volume gain, for a specified sound level as being the root mean square of voltage values applied to a speaker for the recording, based on the ratio of the determined maximum amplitude value to the defined maximum amplitude value.

10. The method according to claim 9, wherein the compressing includes using a psycho-acoustic mask.

11. The method according to claim 10, wherein the compressing includes compression according to MPEG-1 Layer 3 or AAC.

12. The method according to claim 1, further comprising playing the reproduced recording on a jukebox.

13. A method for adjusting sound volume of a plurality of recordings according to a specified sound level as being the root mean square of voltage values applied to a speaker, the method comprising:

determining, for each one of the plurality of recordings individually, a maximum amplitude value for sound frequencies audible for the human ear in a recording, calculating a volume gain, for each one of the plurality of recordings individually, according to the specified sound level, based on the ratio of the determined maximum amplitude value for a recording to a maximum amplitude value for all frequencies combined in the recording corresponding to the specified sound level, and reproducing each one of the plurality of recordings individually by automatically adjusting an amplification level of a recording based on the calculated volume gain for the recording to obtain the specified sound level, wherein the reproducing further comprises, for each one of the plurality of recordings, dynamically adjusting a sound level of a recording by setting a specified gain for low-pitched and/or high-pitched sounds in the recording, the specified gain corresponding approximately to the calculated volume gain applied during the reproducing of the recording.

14. The method according to claim 13, wherein the reproducing comprises:

adjusting the specified sound level based on the calculated volume gains to make the sound levels of the reproduced recordings of the plurality of recordings homogeneous, calculating a second volume gain, for each one of the plurality of recordings individually, according to the adjusted sound level, based on the ratio of the determined maximum amplitude value for a recording to a maximum amplitude value for all frequencies combined in the recording corresponding to the adjusted sound level, and reproducing each one of the plurality of recordings by automatically adjusting an amplification level based on the calculated second volume gain for a recording to obtain the adjusted sound level.

15. A method for adjusting sound volume of a recording, the method comprising:

determining a maximum amplitude value for sound frequencies audible for the human ear in the recording, calculating a volume gain, for a specified sound level as being the root mean square of voltage values applied to a speaker for the recording, based on the ratio of the determined maximum amplitude value to a maximum amplitude value for all frequencies combined corresponding to the specified sound level, and enabling reproduction of the recording by adjusting an amplification level based on the calculated volume gain to obtain the specified sound level, wherein the reproducing further comprises dynamically adjusting a sound level of the recording by authorizing a specified gain for low-pitched and/or high-pitched sounds in the recording, the specified gain corresponding approximately to the calculated volume gain applied during the reproducing of the recording.

* * * * *